United States Patent
Kawamura

(10) Patent No.: US 7,638,001 B2
(45) Date of Patent: Dec. 29, 2009

(54) FILM FORMING APPARATUS, MANUFACTURING MANAGEMENT SYSTEM AND METHOD OF MANUFACTURING SEMICONDUCTOR DEVICES

(75) Inventor: Daisuke Kawamura, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 242 days.

(21) Appl. No.: 11/123,093

(22) Filed: May 6, 2005

(65) Prior Publication Data

US 2005/0263067 A1    Dec. 1, 2005

(30) Foreign Application Priority Data

May 7, 2004  (JP) ............... 2004-138378

(51) Int. Cl.
*B05C 5/02* (2006.01)
*B05D 1/26* (2006.01)

(52) U.S. Cl. .................. 118/692; 118/666; 118/667; 118/708; 118/52; 118/56; 118/319; 118/320; 702/81; 702/82; 702/84

(58) Field of Classification Search ............... 118/666, 118/667, 692, 708, 52, 56, 319, 320; 702/81, 702/82, 84; 427/8; 438/5; 356/237.1
See application file for complete search history.

(56) References Cited

U.S. PATENT DOCUMENTS

| | | | |
|---|---|---|---|
| 5,322,706 A * | 6/1994 | Merkel et al. ............ 427/8 |
| 5,408,405 A * | 4/1995 | Mozumder et al. ......... 700/31 |
| 6,004,047 A | 12/1999 | Akimoto et al. |
| 6,445,969 B1 * | 9/2002 | Kenney et al. ............. 700/108 |
| 6,466,881 B1 * | 10/2002 | Shih et al. .................. 702/84 |
| 6,712,956 B2 | 3/2004 | Kim |
| 2004/0045623 A1 * | 3/2004 | Parker et al. ............... 141/1 |
| 2004/0253737 A1 * | 12/2004 | Haberland et al. .......... 436/55 |

FOREIGN PATENT DOCUMENTS

| | | |
|---|---|---|
| JP | 61-061164 A | 3/1986 |
| JP | 02-137028 U | 11/1990 |
| JP | 05-312747 A | 11/1993 |
| JP | 2003-266006 A | 9/2003 |

OTHER PUBLICATIONS

Notification of Reasons for Rejection, mailed Mar. 27, 2009, from the Japan Patent Office in Japanese Patent Application No. 2004-138378, and English language translation thereof.*

* cited by examiner

*Primary Examiner*—Laura Edwards
(74) *Attorney, Agent, or Firm*—Finnegan, Henderson, Farabow, Garrett & Dunner, L.L.P.

(57) ABSTRACT

A film forming apparatus which forms a film on a substrate by utilizing a chemical solution, including: a correlation data creating unit which creates a correlation data that is related to the quality of a chemical solution, from data that is related to the properties of the chemical solution including at least one of data on storage temperature for the chemical solution to be loaded and data on pressure applied to the chemical solution to be loaded; and a determining unit which determines whether or not the chemical solution holds expected quality thereof on the bases of the correlation data.

9 Claims, 10 Drawing Sheets

FILM FORMING APPARATUS, MANUFACTURING MANAGEMENT SYSTEM AND METHOD OF MANUFACTURING SEMICONDUCTOR DEVICES

CROSS REFERENCE TO RELATED APPLICATION

This application claims benefit of priority under 35 USC §119 to Japanese Patent Application No. 2004-138378, filed on May 7, 2004, the contents of which are incorporated by reference herein.

BACKGROUND OF THE INVENTION

1. Field of the Invention

The present invention relates to a film forming apparatuses, a manufacturing management system, and a method of manufacturing semiconductor devices.

2. Related Background Art

In manufacturing of devices, the formation of a film, such as a SOG (Spin on Glass) film as an insulating layer, an antireflection film used in lithography processes, and a photoresist film, using a chemical solution is being employed in many processes. Most of these chemical solutions deteriorate as time passes; therefore, in general, in order to maintain predetermined performances, or in some cases, in order to ensure safety in manufacturing, manufacturers of such chemical solutions set chemical-solution storage conditions and quality assurance periods.

In the case where the amount of a chemical solution to be used is large enough compared to the capacity of the container of the chemical solution, and where the entire chemical solution in one container is quickly consumed, it is very seldom that the quality assurance period of the chemical solution raises a problem. However, in the case where devices to be manufactured are a wide variety of products in small quantities, whereby the amounts of chemical solutions to be used are little, where the production line for the devices are halted for some reasons, or where any event occurs that halts for a long time processing in film forming processes for the devices, the quality assurance periods of the chemical solutions may expire.

In order to address the foregoing case, when chemical solutions are utilized in film forming apparatuses, the chemical solutions are replaced based on their quality assurance periods. Specifically, a method has been put into practical use in which sequential check is implemented in a periodical and manual way whether or not quality assurance periods have expired, and so has been a quality management system that receives by means of bar codes or the like data on a manufacturing date at the timing when a chemical solution is loaded in a coating system and that issues a warning when the quality assurance period expires.

Among the foregoing problems, the cases where a chemical-solution container is kept being connected with a manufacturing system regardless of the expiration of the quality assurance period include the following two cases: In the first place, relying on a periodical and manual check may cause chemical solutions whose quality assurance periods have expired to be kept being loaded, by a worker's false recognition or by false instructions. In the second place, even when a warning of the expiration of a quality assurance period has been issued by means of bar codes, a worker makes a false recognition.

In addition, even though the quality assurance period of a chemical solution in a chemical-solution container has not expired, the quality assurance period of the chemical solution remaining in the pipeline within a film forming apparatus may have expired. Even though such a rule is adopted in which, after the replacement of the chemical-solution container, the entire chemical solution in the pipeline is disposed of, the false recognition by a worker may make the disposal insufficient.

As discussed above, existing technology may cause the possibility of utilizing chemical solutions whose quality assurance periods have expired.

Moreover, even when quality assurance periods are still valid, if storage conditions for chemical solutions, in particular, temperature management conditions, from manufacturing of the chemical solutions to loading them in a film forming apparatus are inappropriate, the deterioration of the chemical solutions develops. Therefore, a case exists in which management by means of a quality assurance period only is insufficient.

Still moreover, even though temperature management during the time from manufacturing of a chemical solution to loading it in a film forming apparatus is appropriate, if the temperature of the pipeline within the film forming apparatus is inappropriate, the deterioration of the chemical solutions develops in the pipeline, even when the quality assurance period of the chemical solution has not expired. For example, this corresponds to a case where a pipeline within a film forming apparatus is being left at room temperature, while the storage conditions for chemical solutions include low temperature.

Meanwhile, when a chemical solution to be utilized is very expensive, the reduction of its amount to be used is effective to reduction of cost in manufacturing devices. In general, manufacturers of chemical solutions offer quality assurance periods for chemical solutions to be provided, while anticipating a certain extent of safety factors. Accordingly, managing by means of a quality assurance period only may cause chemical solutions that are still usable to be disposed of.

BRIEF SUMMARY OF THE INVENTION

According to a first aspect of the present invention, there is provided a film forming apparatus which forms a film on a substrate by utilizing a chemical solution, comprising:

a correlation data creating unit which creates a correlation data that is related to the quality of a chemical solution, from data that is related to the properties of the chemical solution including at least one of data on storage temperature for the chemical solution to be loaded and data on pressure applied to the chemical solution to be loaded; and a determining unit which determines whether or not the chemical solution holds expected quality thereof on the bases of the correlation data.

According to a second aspect of the present invention, there is provided a method of manufacturing semiconductor devices, comprising a method of forming a film on a substrate, said method of forming a film including:

creating a correlation data that is related to the quality of a chemical solution from data that is related to the properties of the chemical solution including at least one of data on storage temperature for the chemical solution to be loaded and data on pressure applied to the chemical solution to be loaded; and determining whether or not the chemical solution holds expected quality thereof on the bases of the correlation data.

According to a third aspect of the present invention, there is provided a manufacturing management system which allocates product lots to a plurality of external film forming apparatuses which forms films on substrates by utilizing chemical solutions, said film forming apparatuses each comprising a correlation data creating unit which creates correlation data that is related to the quality of a chemical solution from data that is related to the properties of the chemical solution including at least one of data on storage temperature for the chemical solution to be loaded therein and data on pressure applied to the chemical solution to be loaded therein, and a determining unit which determines on the basis of the correlation data whether or not the chemical solution holds expected quality thereof; said manufacturing management system determines for each of the external film forming apparatuses a margin of the chemical solution for the expected quality, based on a result of determination by the determining unit of the external film forming apparatus exterior thereto, and then decides priorities among the film forming apparatuses, based on the results of determination on the margins; and wherein the allocation is implemented by the decided priorities.

According to a fourth aspect of the present invention, there is provided a manufacturing management system connectable to a plurality of external film forming apparatuses which forms films on substrates by utilizing chemical solutions, said film forming apparatuses each comprising a correlation data creating unit which creates correlation data that is related to the quality of a chemical solution from data that is related to the properties of the chemical solution including at least one of data on storage temperature for the chemical solution to be loaded therein and data on pressure applied to the chemical solution to be loaded therein, and a determining unit which determines whether or not the chemical solution holds expected quality thereof on the basis of the correlation data; said manufacturing management system determining for each of the film forming apparatuses a margin of the chemical solution for the expected quality on the basis of a result of determination by the determining unit of said film forming apparatus, deciding priorities among the film forming apparatuses on the basis of the results of determination on the margins, and allocating respective product lots to the film forming apparatuses based on the decided priorities.

According to a fifth aspect of the present invention, there is provided a manufacturing management system connectable to an external film forming apparatus which forms a film on a substrate by utilizing a chemical solution, said film forming apparatus comprising a detecting unit which detects correlation data that is related to the quality of a chemical solution from data that is related to the properties of the chemical solution including at least one of data on storage temperature for the chemical solution to be loaded therein and data on pressure applied to the chemical solution to be loaded therein, said manufacturing management system comprising a determining unit which determines whether or not the chemical solution holds expected quality thereof on the basis of the correlation data received from said external film forming apparatus, and a commanding unit which creates a signal to urge replacement of the chemical solution in response to determination of the determining unit to supply the external film forming apparatus with the signal.

BRIEF DESCRIPTION OF THE DRAWINGS

In the appended drawings.

DETAILED DESCRIPTION OF THE INVENTION

Figure 1:
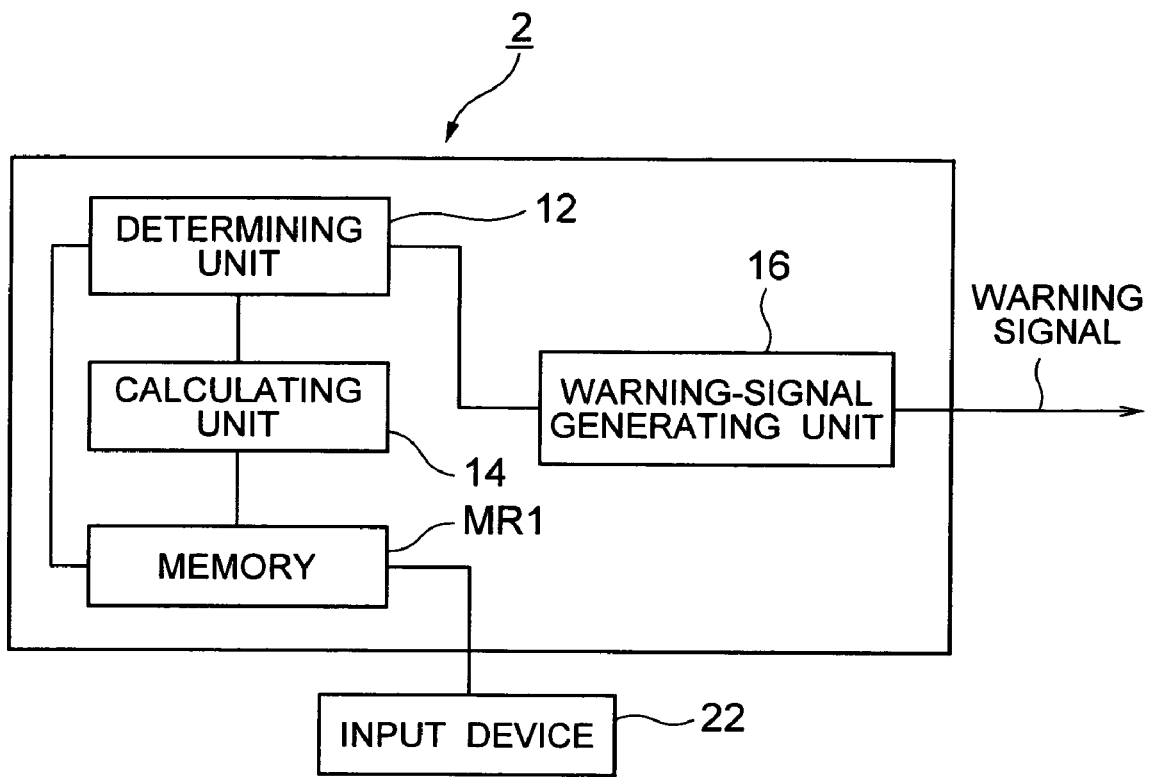
FIG. 1 is a block diagram illustrating the schematic configuration of a film forming apparatus according to Embodiment 1 of the present invention.

Embodiments of the present invention will be discussed, referring to the drawings. Hereinafter, the discussion will be made by dealing with as an example a case where a photoresist film that is utilized in a lithography process of a semiconductor-device manufacturing process is formed, or in which a SOG film that is utilized as part of a multilayered antireflection film is formed. In addition, in each of drawings below, the same parts are indicated with the same reference numbers and duplicate descriptions for the same parts are implemented only if necessary.

(1) Film Forming Apparatus According to Embodiment 1

Figure 2:
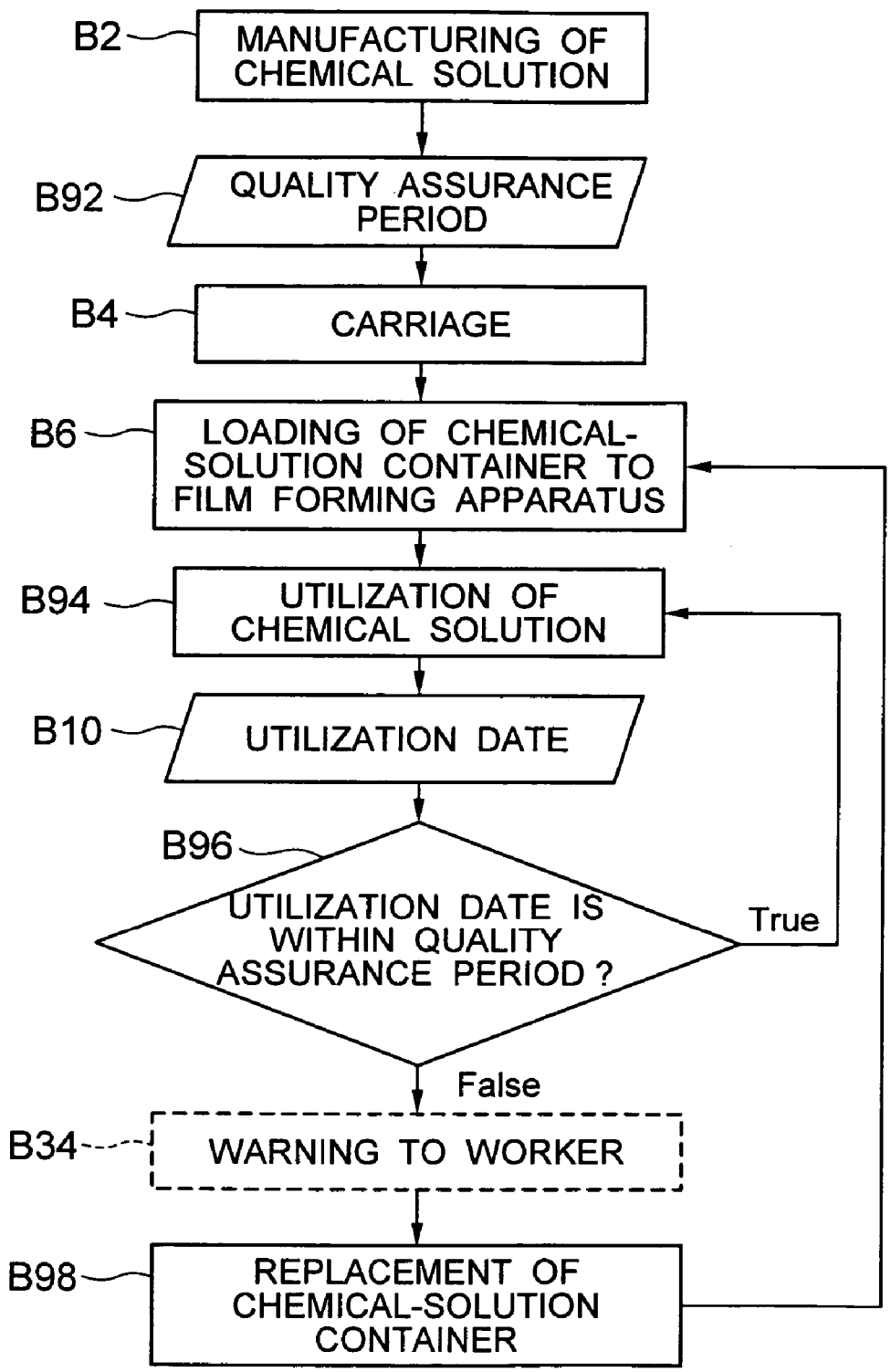
FIG. 2 is a blockchart showing an example of a film forming procedure, as a comparative example, based on conventional technology.

FIG. 1 is a block diagram illustrating the schematic configuration of a film forming apparatus according to Embodiment 1. A film forming apparatus 2 illustrated in FIG. 2 is provided with an input device 22, a memory MR1, a calculating unit 14, a determining unit 12, and a warning-signal generating unit 16. The input device 22 inputs a temperature history of a chemical solution to be utilized for forming a film or predetermined calculation parameters for calculation. The temperature history of a chemical solution, in Embodiment 1, for example, corresponds to data related to properties of the chemical solution. The memory MR1 stores the temperature history inputted, the calculation parameters inputted, and threshold-value information described later. In addition, as described later, the calculating unit 14 may in some cases calculate a threshold value by utilizing data in the memory MR1. The memory MR1 can also store in the form of a recipe file a series procedure of film forming methods described later. In Embodiment 1, the calculating unit 14, for example, corresponds to correlation data creating means, reads out the temperature history data and the calculation parameters from the memory MR1, and then implements predetermined calculation processing. The calculated result, for example, corresponds to correlation data. The determining unit 12 reads out the threshold-value information from the memory MR1, and, by comparing the calculation result calculated by the calculating unit 14 with the foregoing threshold value, determines that the chemical solution to be utilized has desired ability in terms of predetermined properties, thereby outputting a determined result. If the calculation result is false, after receiving the determined result, the warning-signal generating unit 16 generates and outputs a warning signal that urges the worker to replace the chemical solution in a predetermined container or the chemical solution in a predetermined zone.

(2) Comparative Example

Before discussing the operation of the film forming apparatus 2 illustrated in FIG. 1, a comparative example with regard to Embodiment 1 will be referred to. The blockchart in FIG. 2 shows the outline of a chemical-solution management procedure in the case where photoresist solution used in a lithography process of a semiconductor-device forming process is utilized in a prior-art film forming apparatus.

The photoresist solution has a quality assurance period, under predetermined storage conditions, that is set by a photoresist-solution manufacturer and that begins from its manufacturing date. For example, the quality assurance period is six months at room temperature, and, for another example, it is three months at 5° C. (Blocks B2 and B92).

The carried container for the photoresist solution is loaded in a photoresist coating/developing system (Blocks B4 and B6), and then the use of the photoresist solution is started (Block B94). In the loading of the container, the quality assurance period being written on the chemical-solution container is recorded in a predetermined recording paper (Block B10). In the case where a quality management system utilizing bar codes or the like is employed, the quality assurance period is inputted according to a predetermined method.

By periodically checking the recording paper and the chemical-solution containers, whether or not the quality assurance periods of the chemical solutions have expired is sequentially ascertained (Block 96). After the ascertainment, if the quality assurance period has expired, the chemical-solution container is replaced by another container whose quality assurance period has not expired (Blocks B98 and B6). In this situation, in the case where a quality management system utilizing bar codes or the like is employed, a warning is issued to the worker (Block 34). In addition, it is preferable that not only the container is replaced, but also the chemical solution, within the pipeline in the film forming apparatus, whose quality assurance period has expired, is disposed of and is replaced by a new chemical solution.

Many types of chemical solutions are generally replaced before their quality assurance periods expire; however, in the case where the amount of a chemical solution to be used is little, in the case where a periodical check is underestimated, or in other cases, a chemical solution whose quality assurance period has expired is kept being loaded, whereby a performance-deteriorated photoresist film is formed, thereby resulting in reimplementing of a lithography process or a defect in manufacturing.

(3) Processing Procedure in Embodiment 1

Figure 3:
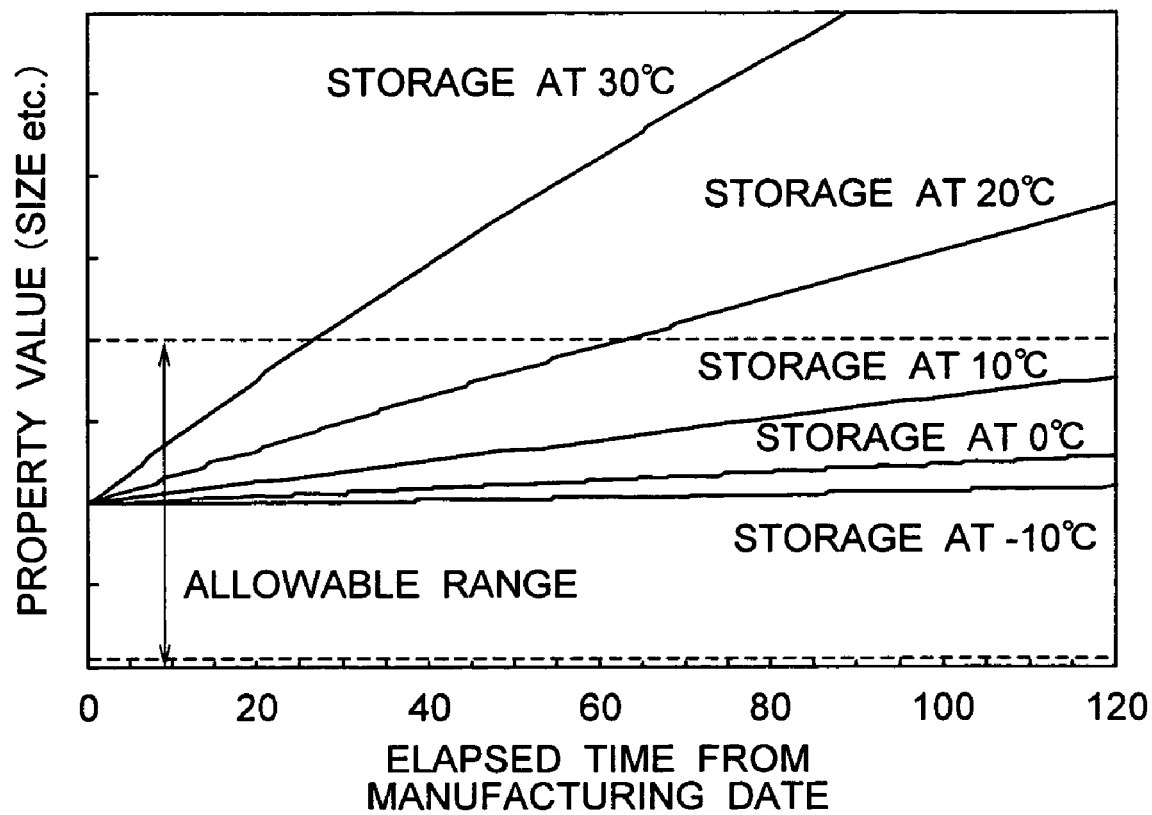
FIG. 3 is a graph, with storage temperature as a parameter, representing an example of a correlation between the number of days that have elapsed since the manufacturing of chemical solutions and characteristic values of photoresist.

Next, the operation of the film forming apparatus 2 illustrated in FIG. 1 will be discussed, referring to FIGS. 3 and 4.

In the present embodiment, the discussion will be made by dealing with a case where a chemical solution for forming a film is utilized while being contained in a deformable container. By applying pressure to such a container, the chemical solution in the container is pushed out without contacting with the pressurized gas.

In the first place, as a procedure of preprocessing, with regard to predetermined properties, of a photoresist solution utilized for forming a target photoresist film, that deteriorates with time, by preliminarily obtaining data for storage temperature and elapse of time, conditions under which the predetermined properties can not be satisfied are calculated in advance. In FIG. 3 is represented an example of the correlation, with storage temperatures as a parameter, between the number of days that have elapsed from the manufacturing date of the chemical solution and characteristic values of photoresist films. In the properties represented in FIG. 3, in the case where the storage condition for the chemical solution is room temperature, for example, in the low 20s° C. in the case of a clean room for semiconductor device manufacture, the entire temperature history beginning from the manufacturing date is important. In contrast, as can be seen in the properties represented in FIG. 3, in the case where the condition for storage and carriage from manufacturing to loading of the chemical solution in a film forming apparatus is −10° C., the number of days that have elapsed during the storage very little affects the predetermined properties of the solution; therefore, the number of days that have elapsed during the storage can substantially be neglected, but if a duration exists in which the storage temperature exceeds −10° C. during carriage of a chemical solution, during storage of a chemical solution, or after the loading of the chemical solution in the film forming apparatus, the temperature history during the duration is important.

The properties, of the photoresist solution, that deteriorate with time include, for example, other than exposure sensitivity of a predetermined pattern under predetermined exposure conditions, change in a photoresist shape under predetermined exposure conditions (one or more types of information on critical dimension of pattern measured with a predetermined method and sidewall angles), the number of defects in film-forming, and the number of defects after development.

Figure 4:
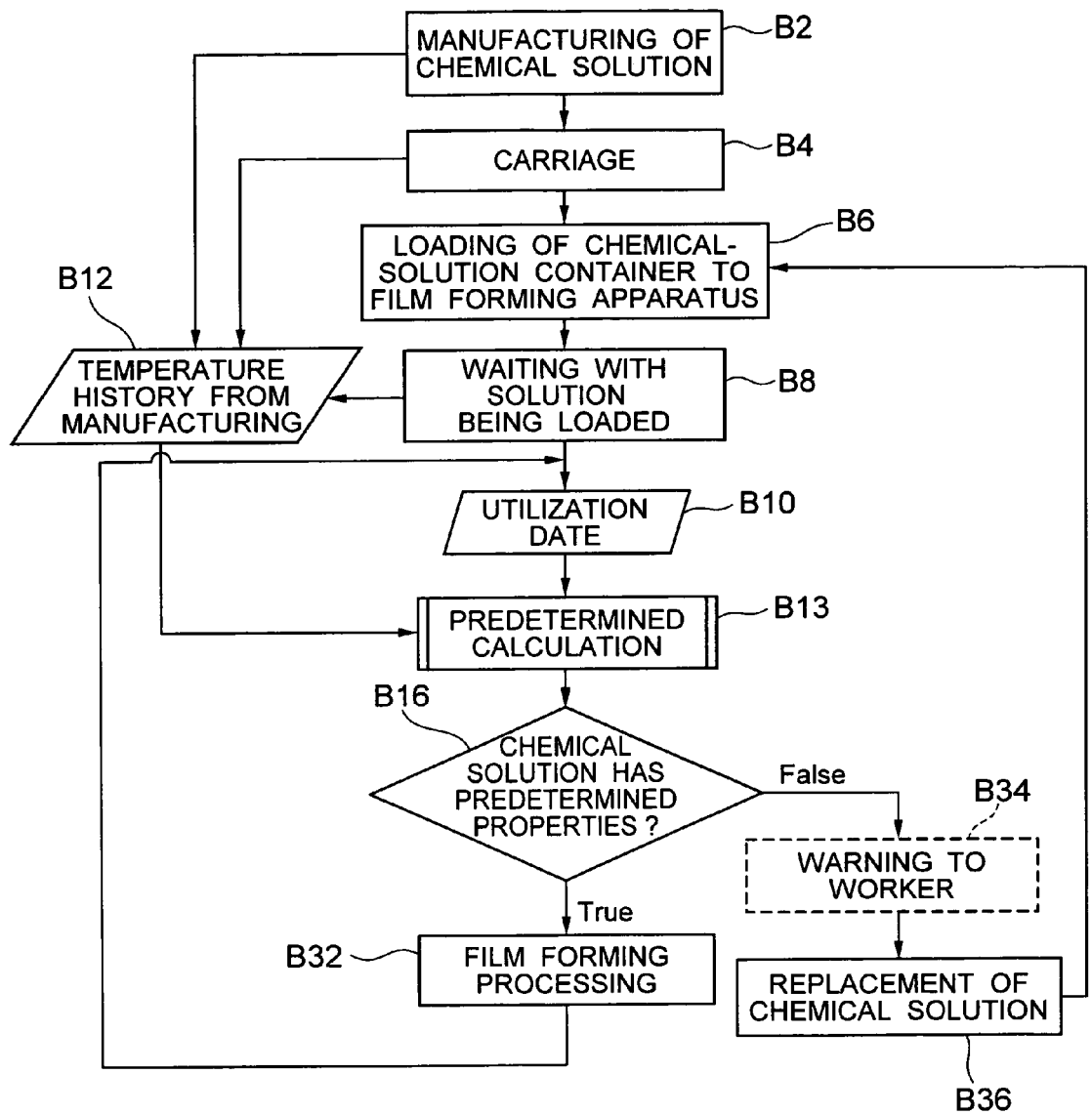
FIG. 4 is a blockchart showing an example of the operating procedure of the film forming apparatus illustrated in FIG. 1.

Next, as shown in FIG. 4, a manufactured and carried chemical-solution container (Blocks B2 and B4) is loaded in a film forming apparatus (Block B6). While the chemical solution is in a standby state after the container has been loaded (Block B8), with regard to the photoresist solution, its temperature history beginning at its manufacturing time is continuously recorded (Block B12). In addition, even when the chemical solution is being utilized, its temperature history beginning at its manufacturing time is continuously recorded.

Then, the temperature history, of the photoresist solution, from the manufacturing to the connection of the chemical solution to the film forming apparatus 2 and the predetermined calculation parameters described above are inputted to the memory MR1 of the film forming apparatus 2 through the input device 22. Prior to the utilization of the photoresist solution (Block B10), i.e., prior to film forming processing (Block B32), the calculating unit 14 of the film forming apparatus 2 implements the calculation processing described above, based on the temperature history data and the calculation parameters (Block B13). After receiving the calculated results, the determining unit 12 determines that the determined performance of the chemical solution to be used has desired properties (Block B16). In the case where the determined result is true, the procedure directly moves to the film forming processing (Block B32). In contrast, if the determined result is false, after receiving the determined result, the warning-signal generating unit 16 of the film forming apparatus 2 generates and outputs a warning signal that urges the worker to replace the chemical solution in a predetermined container or the chemical solution in a predetermined zone (Block B34); the worker who has been indicated by an unillustrated display or a warning sound to replace the chemical solution replaces the container or the chemical solution in the zone (Block B36).

The change in the properties with time, of a chemical solution, is generally a function of temperature and time;

however, it is believed that the function form differs depending on the reaction mechanism of the chemical solution. As the simplest mechanism, a case is conceivable in which, even though the reaction coefficients of compositions, in the photoresist solution, that cause the change with time have temperature dependency, the density of reactive compositions hardly affects the reaction speed. In this case, considering the reaction coefficients up to first-order expansions, the amount of change in the compositions is in proportion to the quadrature by parts of temperature and elapsed time. Accordingly, the determining that the properties of a chemical solution has the predetermined performance may be implemented, by setting a threshold value for the quadrature by parts of temperature and elapsed time, and by utilizing the threshold value an a reference.

In the case where reaction coefficients are complex, by assuming a model function for correlation data between the temperature and the elapsed time, a threshold value for the model function can be set.

Moreover, in the case where a plurality of properties that deteriorates with time exists, or in the case where the properties originate from a plurality of reaction mechanisms, the determination is implemented through logical multiplication of respective determinations. In this situation, determinations that are not critical may be omitted.

Furthermore, properties that indirectly indicate the change in the photoresist properties include the thickness of a film by a predetermined sequence of processing or viscosity, the average molecular weight of a photoresist resin (and the distribution of the molecular weight), or the amount of acid catalyzed functional groups. If these physical properties or chemical compositions can directly be measured with high accuracy and high reproducibility, and have correlations with the photoresist properties, the results of measurement on these values that indirectly indicate the photoresist properties may be added to the data for the determination.

Some methods of recording the temperature history will illustratively described.

In the first place, a method will be discussed in which information on measurement results obtained through a plurality of temperature-measurement devices is integrated. The specific examples of these types of information include: with regard to the duration from the manufacturing to the filling a chemical-solution container, a temperature specified in a management specification of the manufacturer or the temperature history of a chemical-solution filling apparatus; with regard to the storage period of the chemical-solution container at the manufacturer, the record of the temperature history of the storage place or a temperature specified in the management specification; with regard to the duration of carriage from the chemical-solution manufacturer to the semiconductor-device manufacturer, the temperature history of the carriage cabin of a carriage vehicle or a temperature specified in a management specification, if available; and with regard to the duration of storage in a warehouse of the semiconductor-device manufacturer, the temperature history of the inside of warehouse or a temperature specified in a management specification, if available. After the loading of the chemical-solution container in the film forming apparatus, the temperature inside a clean room in which an exposure apparatus is stored, or the temperature specified in a management specification for the clean room, is utilized. With regard to the temperature history up to the connection of the chemical-solution container to the film forming apparatus, the multiplication products of temperature and time theretofore may directly be inputted through the input device 22, and then the multiplication products of the temperature history and the elapsed time, after the connection, may sequentially be added.

As a further simple method, it is possible to utilize IC tags that have recently been drawing attention in diverse industries.

As the first aspect of utilizing an IC tag, there is a method in which, every time a chemical-solution container with an IC tag changes its storage places, the multiplication products of the temperature history and the storage time that have occurred during the duration from the last move until the present move are added to the multiplication products that are aggregated theretofore, or a method in which a predetermined calculation results are held.

As the second aspect of utilizing an IC tag, an IC tag is provided with at least a temperature measuring unit, such as a thermistor or a device utilizing the Seebeck effect, a recording unit, and a timer unit. A temperature value measured every a constant duration that is specified by the timer unit, an integrated value of the measured temperature values, a predetermined calculated value or an aggregated value of predetermined calculated values is stored in the recording unit. In the case of the second aspect of utilizing an IC tag, the temperature history of the chemical-solution container itself can be utilized; therefore, it is possible to implement with high accuracy the determination that the photoresist solution has desired performance for predetermined properties.

According to the present embodiment, it is possible to accurately estimate the duration in which a chemical solution that deteriorates with time demonstrates its desired properties. More particularly, effects to be obtained include two types; as far as the first effect is concerned, by avoiding a case of utilizing a chemical solution whose properties has deteriorated, the quality of devices can be improved, and eventually, the yield rates of devices can be raised. As far as the second effect is concerned, even when a quality assurance period that was granted by the manufacturer has expired, successive utilization is permitted if a chemical solution has desired properties; therefore, the costs of chemical solutions and waste-solution disposal can be reduced.

The first effect described above will be discussed in more detail. If a management process whose temperature management is inappropriate exists during the duration from the manufacturing of the chemical solution to the forming of films by a film forming apparatus, a case occurs in which the chemical solution can not satisfy the determined properties even though its quality assurance period has not expired. For example, because of an accident of a delivery vehicle, or in a storage warehouse, in summer and the like, the storage temperature for the chemical solution may rise. Even in such a case, through the film forming apparatus 2 according to the present embodiment, by determining it false, based on the temperature history, that the chemical solution has the desired properties, or by disposing of a deteriorated chemical solution, deteriorated properties and poor properties of devices due to the utilization of such a deteriorated chemical solution can be prevented, whereby the yield rate can be enhanced.

The second effect described above will be discussed in more detail. If a manufacturer of chemical solutions sets quality assurance periods, while anticipating a certain extent of safety factors, the management based on the quality assurance periods causes chemical solutions that can still demonstrate desired properties to be disposed of; therefore, the chemical solutions to be disposed of make the costs of chemical solutions and the cost of disposing of chemical solutions increase. According to the present embodiment, based on preliminarily obtained data, by utilizing the temperature history of a chemical solution, if it is determined to be true that the chemical solution has the predetermined properties, the usable chemical solution can be used continuously, whereby it is possible to reduce the cost. The second effect becomes particularly outstanding in the case where expensive chemical solutions are utilized.

(4) Embodiment 2

Next, Embodiment 2 of the present invention will be discussed, referring to FIG. 5.

In the present embodiment, unlike Embodiment 1 described above, the discussion will be made by dealing with a case where a chemical solution to be used is contained in a container that discharges the chemical solution by means of pressure-applying gas (e.g., nitrogen or basic-substance-removed air).

The film forming apparatus 2 illustrated in FIG. 1 can be utilized also in the present embodiment. As a predetermined calculation that is implemented by the calculating unit 14 and that is to describe the change with time in the properties of a chemical solution, the calculation utilizing the quadrature by parts of temperature and elapsed time that has been utilized in Embodiment 1, as the simplest method, is employed.

In the case of a chemical-solution bottle conceived in Embodiment 2, a photoresist solution deteriorates its performance, depending on the elapsed time during which the bottle is being loaded in the film forming apparatus and the photoresist solution is being contacting with the pressure-applying gas. The resolution limit is a typical example of performance that deteriorates. In this case, it is preferable to determine that the photoresist has predetermined performance for predetermine properties, while taking into consideration a duration from the loading as well.

Figure 5:
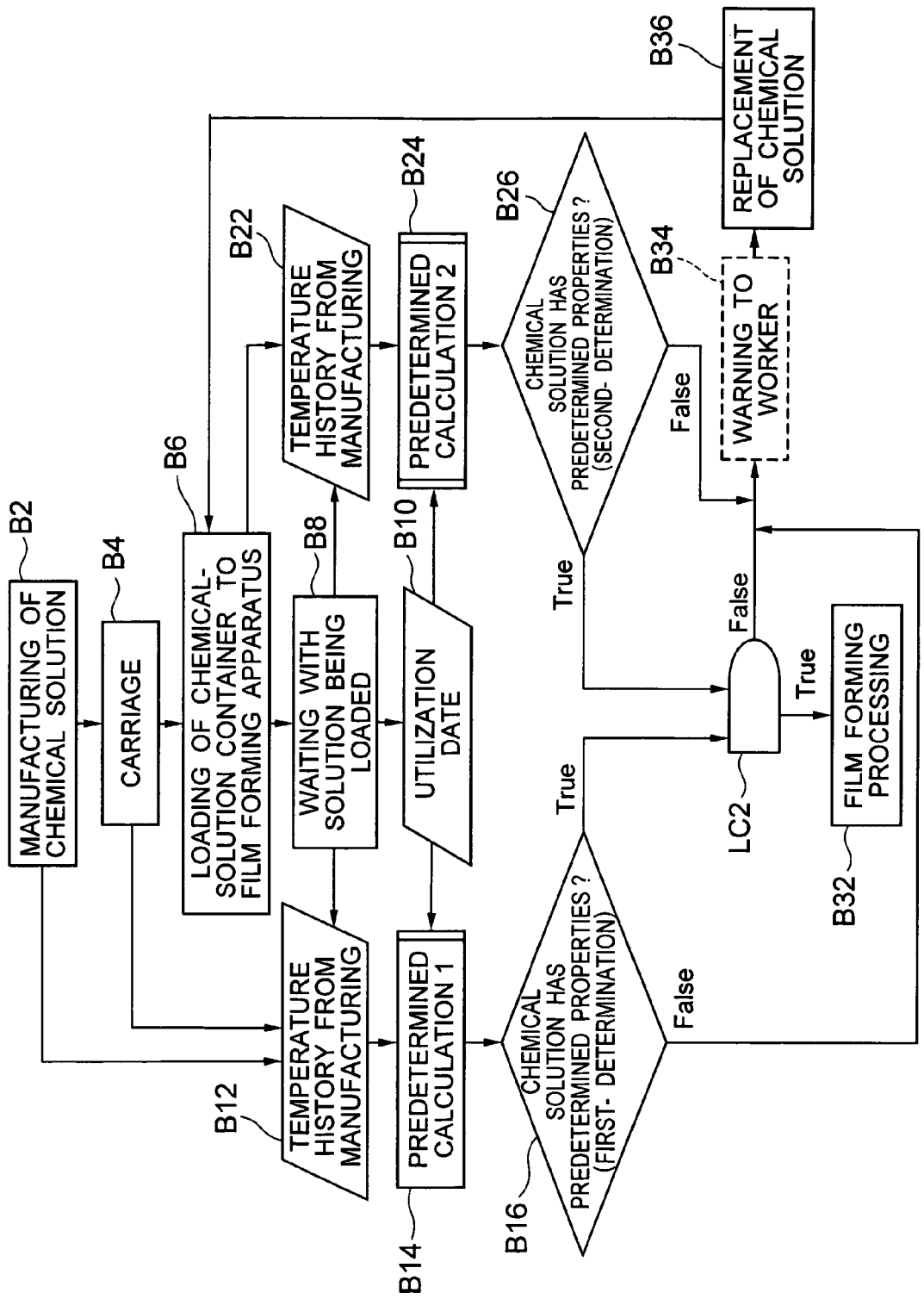
FIG. 5 is a blockchart showing the schematic procedure of Embodiment 2 of the present invention.

In Embodiment 2, by obtaining the data (e.g., the data corresponds to correlation data) for acquiring a relationship between the temperature and the time (e.g., the temperature and the time correspond to data related to the properties of a chemical solution) during which the photoresist solution is being contacting with the pressure-applying gas, and the photoresist-performance deterioration caused by the above-mentioned temperature and the time, a threshold value for the aggregate sum of the products of the chemical-solution temperature and the elapsed time is calculated, as is the case with Embodiment 1 (Blocks B22, B24 and B26 in FIG. 5).

The calculating unit 14 of the film forming apparatus 2 calculates the aggregate sum of the products of the chemical-solution container temperature and the elapsed time, after the loading; the determining unit 12 compares the aggregate sum with the threshold value to implement a determination. The criteria are the same as those in Embodiment 1.

However, in Embodiment 2, by dealing with a case, as a typical example, where the storage at a chemical-solution manufacturer or a device manufacturer is implemented at a high temperature or for a long time, or at a high temperature and for a long time, the temperature history from the manufacturing of a chemical solution may be considered according to the same method as that in Embodiment 1 described above. In Embodiment 2, the determination is implemented by utilizing the logical multiplication (LC2) of the determination on the value calculated by utilizing the temperature history from the manufacturing of a chemical solution (Block B16), and the determination on the value calculated by utilizing the temperature history from the loading of a chemical-solution container (Block B26). In other words, when the two determinations are true, the determination in Embodiment 2 is true.

(5) Embodiment 3

Next, Embodiment 3 of the present invention will be discussed, referring to FIGS. 6 and 7.

Figure 6:
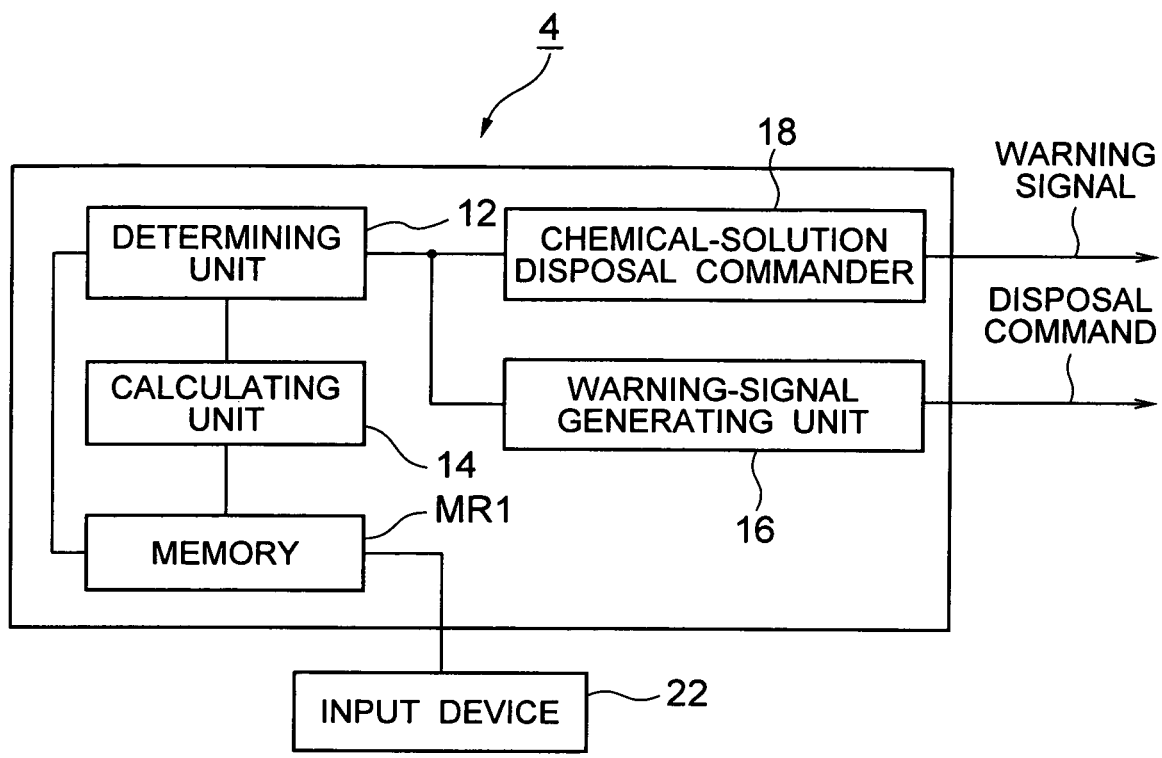
FIG. 6 is a block diagram illustrating the schematic configuration of a film forming apparatus according to Embodiment 3 of the present invention.

FIG. 6 is a block diagram illustrating the schematic configuration of a film forming apparatus according to Embodiment 3. As is clear from the comparison to FIG. 1, a film forming apparatus 4 illustrated in FIG. 6 is provided with a chemical-solution disposal commander 18, in addition to the configuration in FIG. 1. The rest of the configuration of the film forming apparatus 4 is substantially the same as that of the film forming apparatus 2 of Embodiment 1.

Figure 7:
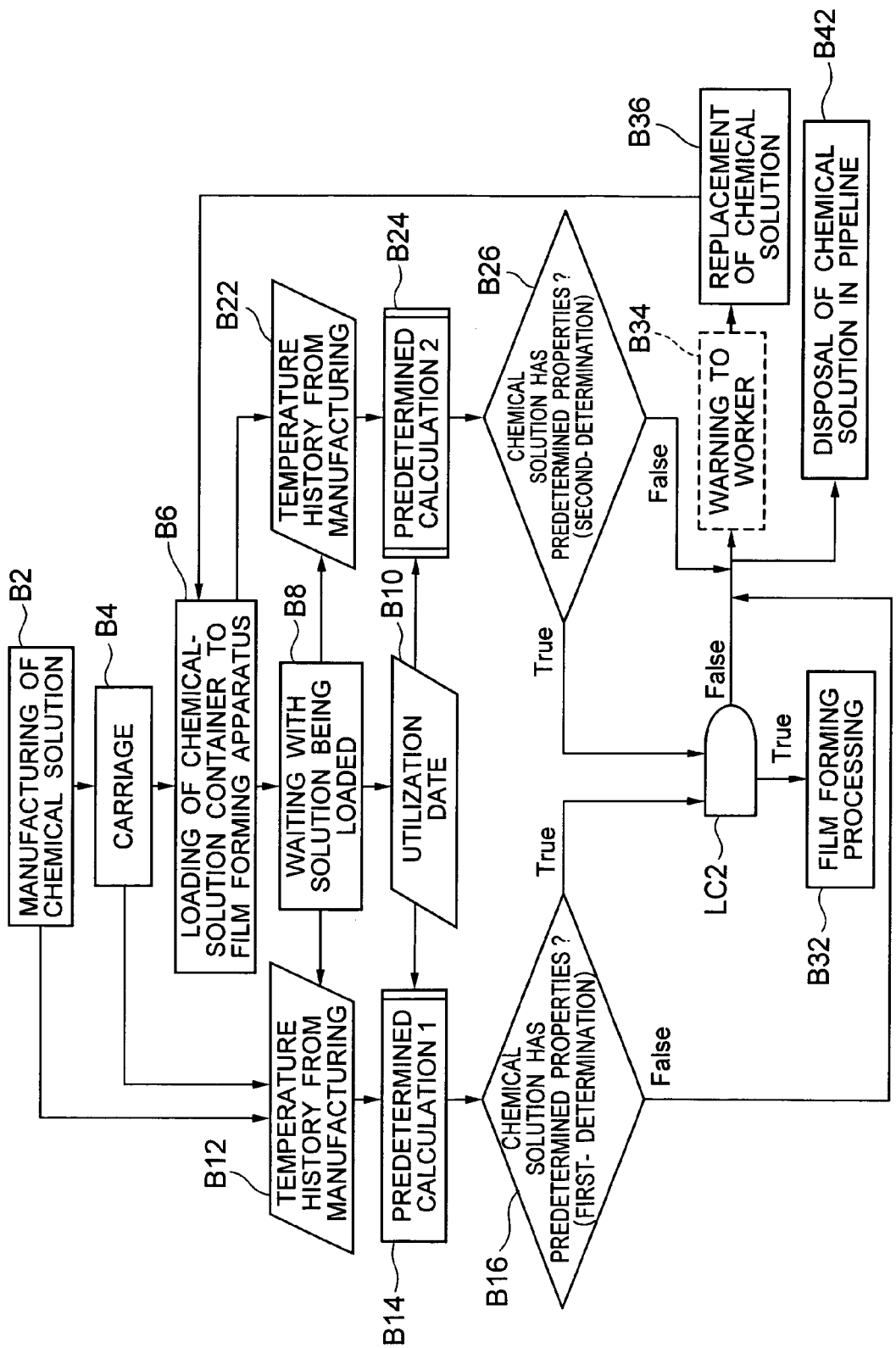
FIG. 7 is a blockchart showing an example of the operating procedure of the film forming apparatus illustrated in FIG. 6.

In the film forming apparatus 4 illustrated in FIG. 6, if the result of a determination by the determining unit 12 is false, the chemical-solution disposal commander 18 creates a disposal command signal and sends it to an unillustrated valve opening/closing device; in consequence, the chemical solution remaining within the path from the chemical-solution outlet (refer to FIG. 8) of a chemical-solution container to the discharging nozzle NZ (refer to FIG. 8) for a substrate is automatically disposed of (Block B42 in FIG. 7).

In Embodiment 3, it is necessary to appropriately figure out the volume of the chemical solution remaining in each of pipelines, in respective zones, that are provided in the film forming apparatus 4.

In disposing of a chemical solution, as Embodiments 1 and 2 described above, by issuing an indication that urges the replacement of a chemical-solution container, concurrently with a disposal command (Block B34), the disposal of remaining chemical solution may be controlled after the replacement of the chemical-solution container (Block B36).

According to Embodiment 3, by determining that chemical solutions situated in respective portions within a pipeline have predetermined properties, if the determination turns out to be false, it is possible to more accurately calculate the amount of a chemical solution to be disposed of. Accordingly, not only a chemical solution whose performance has deteriorated can be prevented from being continually utilized by mistake, but also the cost of treating the waste solutions can be reduced; furthermore, the amount of a replaced chemical solution that is made to flow in a pipeline is reduced, thereby enabling the cost of chemical solution to be reduced.

(6) Embodiment 4

Embodiment 4 is characterized by that, in a semiconductor production line that is equipped with a plurality of film forming apparatuses, by anticipating the temperature history up to the scheduled processing time instant of a production lot (Lot) to be processed by a film forming apparatus on which attention is focused, and by preliminarily determining that a needed chemical solution has its desired properties, unevenness in device properties is suppressed.

A typical semiconductor production line is provided with an upper-layer manufacturing management system that is informatively coupled to apparatuses in the production line; the scheduled arrival time instants of lots to be processed with respective film forming apparatuses are transmitted from the manufacturing management system to the respective lower-layer film forming apparatuses. In such a film forming apparatus, with regard to a chemical solution required to process a production lot on which attention is focused, the temperature history of the chemical-solution container during the duration from the time point of implementing determination processing to the scheduled time instant of starting processing of the production lot is anticipated. After that, in the same manner as that described above in Embodiment 1 or Embodiment 2, by utilizing at least one of two pairs, i.e., the elapsed time from the manufacturing of a chemical solution and the temperature history including the foregoing anticipation, at the scheduled time instant of processing the production lot, and the elapsed time from the loading of a chemical-solution container to the film forming apparatus and the temperature history including the foregoing anticipation, at the scheduled time instant of processing the production lot, the determination that the chemical solution has desired performance for predetermined properties is implemented. The film forming apparatus is provided with a mechanism in which, if the foregoing determination is false, a signal that urges the worker to replace the chemical solution within the pipeline in the related zone is issued, and the chemical solution within the pipeline in the zone is automatically disposed of.

In consequence, by disposing of the chemical solution on which the false determination was implemented with regard to the foregoing properties, it is possible to prevent deteriorated chemical solutions from being utilized. Moreover, in Embodiment 4, the chemical solution is replaced before the production lot is delivered to the film forming apparatus, in particular, not immediately before the processing of wafers, but while ensuring some extent of time margin; therefore, it can be prevented that, due to a pause of the film forming apparatus while a chemical solution whose properties have deteriorated is replaced, waiting time occurs. Still moreover, by implementing the foregoing determination for each production lot, disposal processing can be carried out between production lots; therefore, change in film forming properties between production lots, and eventually, instability of device properties, due to the replacement of the chemical solution while the processing of a plurality of substrates that configures each production lot, can be suppressed.

As methods of anticipating the temperature history up to the processing of a lot, for example, the following two approaches are conceivable:

1) A method of extrapolating a temperature history up to the determination starting time point 2) A method of employing as a specified value the management reference temperature of a clean room in which a film forming apparatus on which attention is focused operates It goes without saying that other methods than those listed above can be employed, if they are appropriate.

(7) Embodiment 5

Next, Embodiment 5 of the present invention will be discussed, referring to FIGS. 6, 8, and 9.

Embodiment 5 is characterized by being configured in such a way that, in the film forming apparatus 4 illustrated in FIG. 6, the determining unit 12 implements the determination, for each section of a pipeline through which a chemical solution passes, that the chemical solution has desired properties, and that, if there is a section for which the result of the determination is false, by a command signal from the chemical-solution disposal commander 18, the chemical solution of an amount that approximately corresponds to the pipeline capacity from the section with determination result of being false to the front edge of a nozzle is automatically disposed of.

Figure 8:
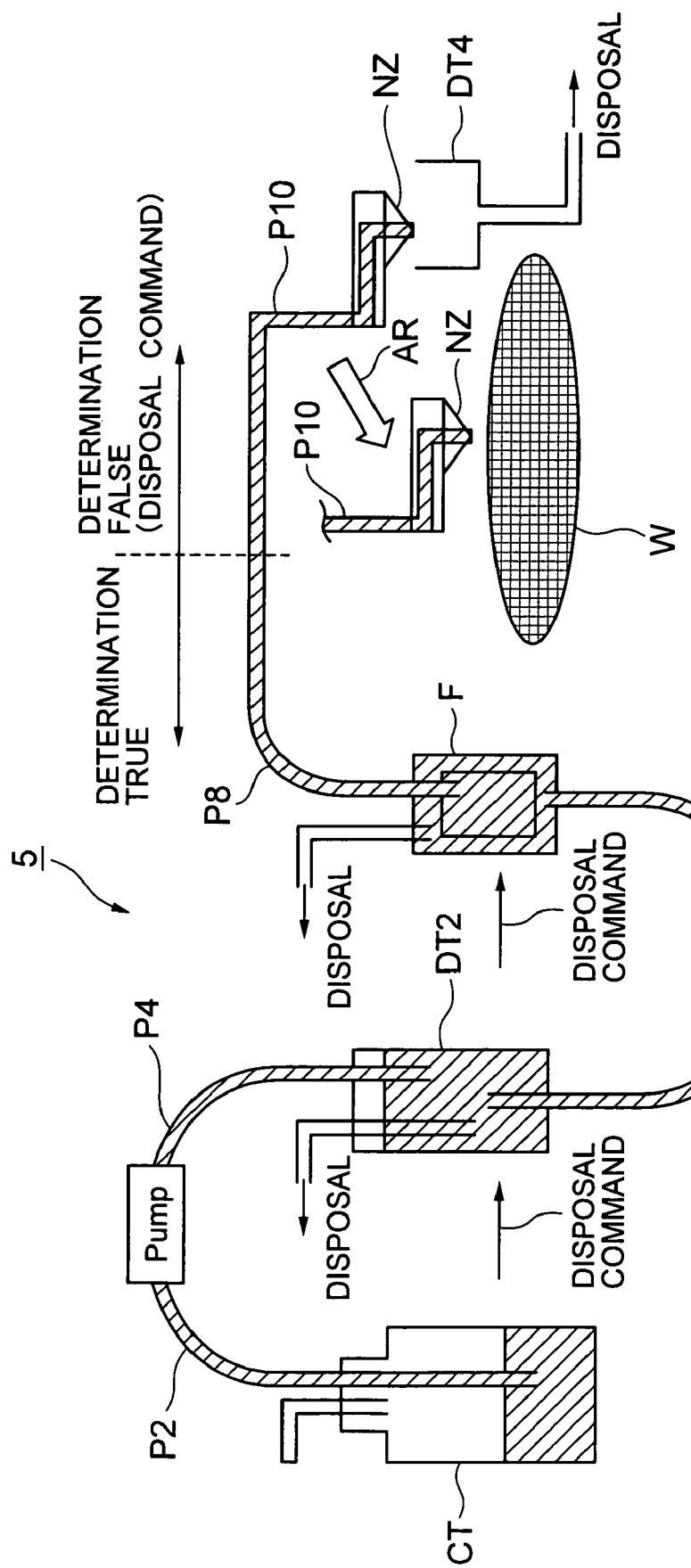
FIG. 8 is a block diagram illustrating principal parts of a film forming apparatus according to Embodiment 5 of the present invention.

FIG. 8 illustrates the principal parts of a film forming apparatus 5 according to Embodiment 5. In drain tanks DT2 and DT4 and in a filter F, unillustrated valve opening/closing devices are provided; in the case where a command signal is issued from the chemical-solution disposal commander 18 (refer to FIG. 6), each valve is opened, and then the chemical solution remaining in the pipeline is disposed of. In addition, the result of the determination by the determining unit 12 (refer to FIG. 6) of the film forming apparatus 5 is true, as indicated by an arrow AR in FIG. 8, the pipeline P10 is carried in such a way that the discharging nozzle NZ is situated above a wafer W, and then the chemical solution is applied onto the wafer W.

In Embodiment 5, because chemical solutions to be utilized are liquid, even the chemical solutions in the adjacent location within a pipeline include mixed chemical solutions whose temperature histories are different in a strict sense. Accordingly, as methods based on assumption of the mixture of chemical solutions, for example, the following two methods are conceivable.

1) In the determination, taking into consideration distances from the chemical-solution container, the disposal of each chemical solution is implemented on the basis of a certain volume or a certain proportion of volume, or a certain volume and a certain proportion of volume, of each chemical solution, within the capacity of the pipeline from the place where the determination is false to the front edge of the nozzle.

Figure 9:
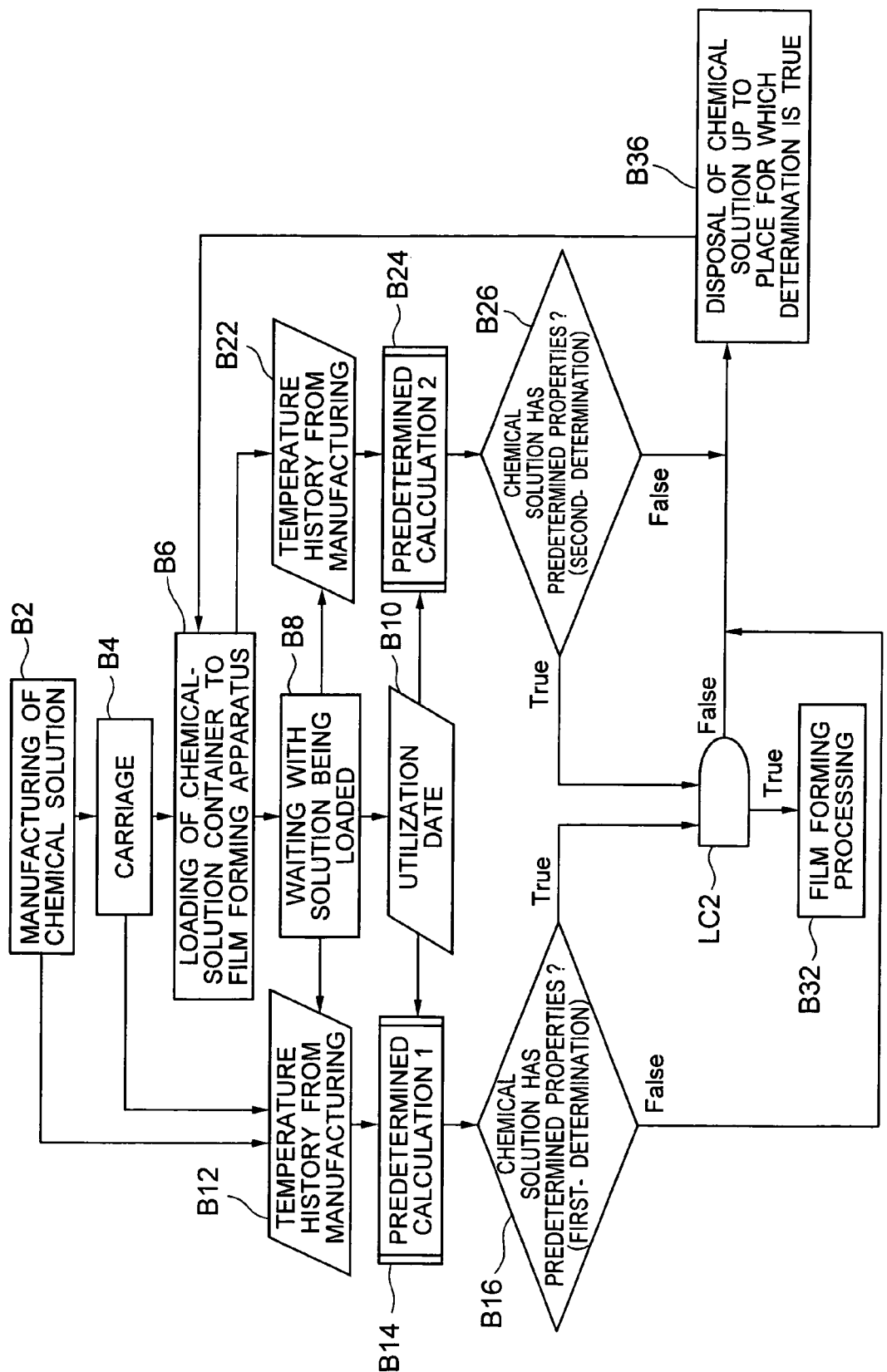
FIG. 9 is a blockchart showing the schematic procedure of Embodiment 5 of the present invention.

2) By assuming that there is the mixture of chemical solutions within a certain distance from the determination place on which attention is focused, and by implementing the determination on the chemical solution in the place that is the most disadvantageous to the determination (in effect, in a predetermined place that is closer to the front edge of the nozzle than the place on which attention is focused is), the disposal of chemical solutions within the capacity of the pipeline from the place that is the determination place, or that is closer to the chemical-solution container by the certain distance than the determination place is, to the front edge of the nozzle is implemented (Block B46 in FIG. 9).

According to Embodiment 5, the amount of chemical solutions to be disposed of can be reduced more than the amount in the case of Embodiment 4 described above.

(8) Embodiment 6

In a semiconductor production line in which the upper-layer manufacturing management system that has been dealt with in Embodiment 4, when production-lot processing is allocated to the foregoing plurality of film forming apparatuses, the production lot in which the foregoing chemical solution on which attention is focused is preferentially allocated to the system in which a chemical solution is loaded that has the smallest margin between a predetermined threshold value and the result of a predetermined calculation based on the temperature history and the elapsed time from the manufacturing date or the elapsed time from loading in a system, of a chemical solution that is utilized for the foregoing film forming on which attention is focused, or based on the temperature history, and the elapsed time from the manufacturing date and the elapsed time from loading in a system. In consequence, the amount of chemical-solutions to be disposed of in all of the plurality of film forming apparatuses can be further reduced.

(9) Embodiment 7

Figure 10:
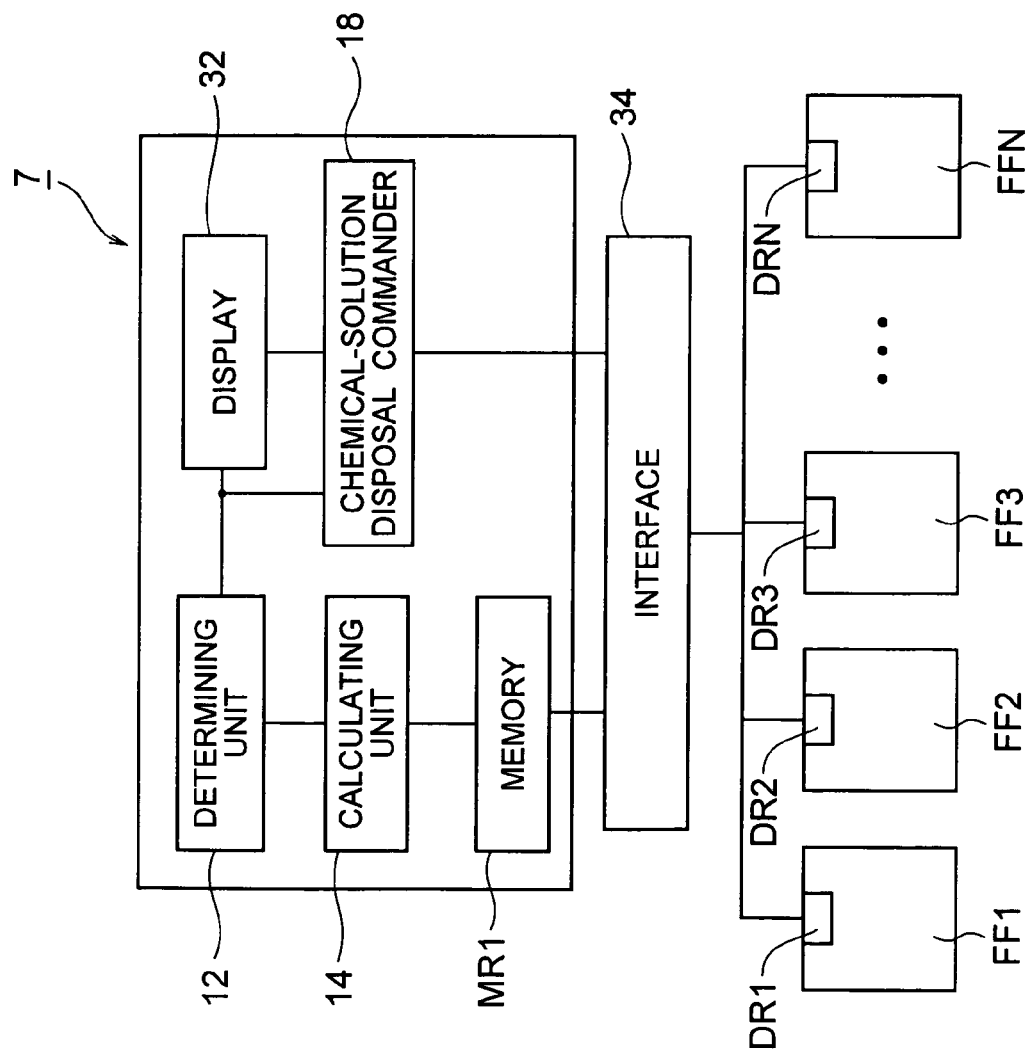
FIG. 10 is a block diagram illustrating a manufacturing management system and a film forming apparatus connected thereto, according to Embodiment 7 of the present invention.

FIG. 10 is a block diagram for explaining Embodiment 7 of the present invention. FIG. 7 shows a film forming apparatus comprising a manufacturing management system 7 as an upper system and film forming apparatuses FF1 to FFN (N is a natural number), as a lower system, connected to the manufacturing management system 7.

The film forming apparatuses FF1 to FFN comprise respective detectors DR1 to DRN that each measures the temperature of a chemical solution to be loaded and applied pressure, if necessary, and supply the manufacturing management system 7 with the measurement results along with information on elapsed time.

The manufacturing management system 7 comprises an interface 34 that enables the information transfer between the manufacturing management system 7 and the film forming apparatuses FF1 to FFN, the memory MR1, the calculating unit 14, the determining unit 12, the chemical-solution disposal commander 18, and a display 32 that displays the result of determination by the determining unit 12. The chemical-solution disposal commander 18 according to Embodiment 7 corresponds to, for example, commanding means. The manufacturing management system 7 calculates in the same way as those described above in Embodiments 1 and 2 the temperature history or the pressure history of a chemical solution, based on measurement values supplied by each of the film forming apparatuses FF1 to FFN, determines that the chemical solution loaded in each film forming apparatus has its expected quality, for each apparatus and for each section of the pipeline that each apparatus possesses, and displays the determination results on the display 32. In addition, according to the results of determination by the determining unit 12, the chemical-solution disposal commander 18 of the manufacturing management system 7 creates for each film forming apparatus and for each section of the pipeline of each apparatus a signal commanding that the chemical solution in which section of the pipeline of which apparatus should be replaced, and supplies each of the film forming apparatuses FF1 to FFN with that signal. The film forming apparatus that has received the signal implements the disposal and the replacement of the chemical solution, according to the command from the chemical-solution disposal commander 18.

According to Embodiment 7, the utilization of a chemical solution whose quality and performance has deteriorated can accurately and systematically be prevented, while the continual utilization of a chemical solution that is usable can systematically be realized; therefore, a film forming apparatus that can form films at a high yield rate and at a low production cost is provided.

(10) Manufacturing Method of Semiconductor Device

The manufacturing of semiconductor devices by utilizing the film forming method that comprises a series of processing procedures described above enables the semiconductor devices to be manufactured at a high yield rate and at a low production cost.

Some embodiments of the present invention have been discussed heretofore; the present invention is by no means limited to the foregoing embodiments, and it is obvious that various modifications of the present invention can be implemented within the technical scope thereof. For example, in the foregoing embodiments, cases where the present invention is applied to semiconductor devices have been discussed; however, devices to which the present invention is applied are by no means limited to semiconductor devices, and the present invention can also be applied to liquid crystal devices, dielectric devices, optical devices, and organic devices that involve the formation of films during the manufacturing thereof. Moreover, types of chemical solutions are not limited to photoresist films and SOG films described above; it goes without saying that the present invention can also be applied, for example, to general film-forming-type antireflection films, interlayer insulation films, color filter materials, and the like. For example, in film-forming-type antireflection films, properties that deteriorate with time include a complex refractive index (or antireflective performance corresponding to the complex refractive index), the number of defects in film-forming, the density of acid substances in a film (or photoresist deformation corresponding to the density of acid substances in a film), an etching speed (pattern-shape deformation corresponding to the etching speed), and the like. In interlayer insulation films, properties that deteriorate with time are values related to electric insulation, such as a dielectric constant and film density.

In addition, the determination has been implemented on the basis of whether the proposition that a chemical solution has its desired properties with regard to specific properties is true; however, a process of determination may be employed which involves determination formulas and processes substantially equivalent, e.g. contraposition.

What is claimed is:

1. A film forming apparatus which forms a film on a substrate by utilizing a chemical solution, comprising:
    a pipeline which leads the chemical solution from an external solution container when the container is loaded on the film forming apparatus;
    a nozzle, coupled to the pipeline, which discharges the chemical solution through the pipeline to apply the chemical solution onto the substrate, the film being formed from the chemical solution;
    a correlation data creating unit, coupled to a first detector measuring an applied pressure of the chemical solution and providing data on a time period during which the pressure is applied and to receive the data on the time period from the first detector, which creates a correlation data that is related to quality of the chemical solution, from data that is related to the properties of the chemical solution including the data on the time period;
    a determining unit, responsive to the correlation data, which determines whether or not the chemical solution holds expected quality thereof on the bases of the correlation data; and a chemical-solution disposal commander that makes the chemical solution be disposed of, in response to the determination of the determining unit.

2. The film forming apparatus according to claim 1, wherein the correlation data creating unit is further coupled to a second detector that measures a storage temperature of the chemical solution along with data on a time from an arbitrary time period to a time point when the chemical solution is utilized to receive the measured temperature and the data on the time period, and
    wherein the data that is related to the properties of the chemical solution further includes temperature history data that represents a history of the storage temperature.

3. The film forming apparatus according to claim 2,
    wherein the arbitrary time point is a time point when the chemical solution is loaded.

4. The film forming apparatus according to claim 1,
    wherein the correlation data is created for arbitrary places within the pipeline, and the determining unit determines for each of the arbitrary places whether or not the chemical solution holds the expected quality.

5. The film forming apparatus according to claim 1,
    wherein the pipeline can be divided into a plurality of sections, the correlation data is created for each of the sections, and
    wherein the determining unit determines for each of the sections whether or not the chemical solution holds the expected quality.

6. The film forming apparatus according to claim 1, which further
    comprises a warning-signal generating unit which creates a warning signal that urges replacement of the chemical solution in response to the determination of the determining unit.

7. A film forming apparatus which forms a film on a substrate by utilizing a chemical solution, comprising:

a pipeline which leads the chemical solution from an external solution container when the container is loaded on the film forming apparatus;

a nozzle, coupled to the pipeline, which discharges the chemical solution through the pipeline to apply the chemical solution onto the substrate, the film being formed from the chemical solution;

a correlation data creating unit, coupled to a detector measuring a temperature and pressure applied to the chemical solution and providing the measured temperature and pressure along with data on a time period during which the pressure is applied to receive the measured temperature and applied pressure and the data on the time period, which creates a correlation data that is related to quality of the chemical solution, from data that is related to properties of the chemical solution including at least one of the measured temperature and the measured pressure applied to the chemical solution to be loaded;

a determining unit, responsive to the correlation data, which determines whether or not the chemical solution holds expected quality thereof on the bases of the correlation data, and a chemical-solution disposal commander that makes the chemical solution be disposed of, in response to the determination of the determining unit.

8. The film forming apparatus according to claim 7, wherein the correlation data is created for arbitrary places within the pipeline, the determining unit determines for each of the arbitrary places whether or not the chemical solution holds the expected quality, and wherein the chemical-solution disposal commander makes the chemical solution contained in part of the pipeline be disposed of.

9. The film forming apparatus according to claim 7, wherein the pipeline can be divided into a plurality of sections, the correlation data is created for each of the sections, the determining unit determines for each of the sections whether or not the chemical solution holds the expected quality, and wherein the chemical-solution disposal commander makes the chemical solution be disposed of.

* * * * *